(12) United States Patent
Lee et al.

(10) Patent No.: US 10,158,094 B2
(45) Date of Patent: Dec. 18, 2018

(54) ORGANIC LIGHT EMITTING DIODE AND DISPLAY DEVICE INCLUDING THE SAME

(71) Applicant: SAMSUNG DISPLAY CO., LTD., Yongin-si, Gyeonggi-do (KR)

(72) Inventors: Joon Gu Lee, Yongin-si (KR); Jae Sik Kim, Yongin-si (KR); Yeon Hwa Lee, Yongin-si (KR); Se Hoon Jeong, Yongin-si (KR)

(73) Assignee: SAMSUNG DISPLAY CO., LTD., Yongin-si, Gyeonggi-do (KR)

(*) Notice: Subject to any disclaimer, the term of this patent is extended or adjusted under 35 U.S.C. 154(b) by 0 days.

(21) Appl. No.: 15/613,728

(22) Filed: Jun. 5, 2017

(65) Prior Publication Data

US 2018/0040843 A1 Feb. 8, 2018

(30) Foreign Application Priority Data

Aug. 3, 2016 (KR) .......................... 10-2016-0099120

(51) Int. Cl.
| | | |
|---|---|---|
| *H01L 51/50* | (2006.01) | |
| *H01L 27/32* | (2006.01) | |
| *H01L 51/00* | (2006.01) | |
| *H01L 51/52* | (2006.01) | |

(52) U.S. Cl.
CPC ........ *H01L 51/506* (2013.01); *H01L 27/3262* (2013.01); *H01L 27/3265* (2013.01); *H01L 27/3276* (2013.01); *H01L 51/0097* (2013.01); *H01L 51/5072* (2013.01); *H01L 51/5088* (2013.01); *H01L 51/5237* (2013.01)

(58) Field of Classification Search
CPC ........................ H01L 51/0032–51/0095; H01L 27/3202–27/3204; H01L 27/3209; H01L 27/3225–27/3234; H01L 27/3241–27/3297; H01L 27/288; H01L 27/32–27/326; H01L 51/50–51/5012; H01L 51/525–51/528
See application file for complete search history.

(56) References Cited

U.S. PATENT DOCUMENTS

| | | | |
|---|---|---|---|
| 7,750,554 B2 | 7/2010 | Shin | |
| 2010/0207149 A1* | 8/2010 | Kim | .................... H01L 51/5271 257/98 |
| 2015/0069382 A1* | 3/2015 | Ahn | .................... H01L 29/7869 257/43 |
| 2016/0254330 A1* | 9/2016 | Uchida | ............... H01L 51/5068 257/40 |

* cited by examiner

*Primary Examiner* — Cuong B Nguyen
(74) *Attorney, Agent, or Firm* — F. Chau & Associates, LLC

(57) ABSTRACT

Disclosed is an organic light emitting diode, including a cathode electrode and an anode electrode positioned above the cathode electrode. An emitting layer is positioned between the cathode electrode and the anode electrode. An electron transporting unit is positioned between the cathode electrode and the emitting layer. The electron transporting unit is configured to inject and transport electrons to the emitting layer. A buffer layer is disposed between the cathode electrode and the electron transporting unit. The buffer layer includes an organic layer and a metallic layer disposed on the organic layer.

20 Claims, 4 Drawing Sheets

ORGANIC LIGHT EMITTING DIODE AND DISPLAY DEVICE INCLUDING THE SAME

CROSS-REFERENCE TO RELATED APPLICATION

This application claims priority under 35 U.S.C. § 119 to Korean Patent Application No. 10-2016-0099120, filed on Aug. 3, 2016, in the Korean Intellectual Property Office, the disclosure of which is incorporated by reference herein in its entirety.

1. TECHNICAL FIELD

Exemplary embodiments of the present invention relate to an organic light emitting diode, and more particularly to a display device including the same.

2. DISCUSSION OF RELATED ART

An organic light emitting display may be a self-emitting device. An organic light emitting display may have a relatively wide viewing angle, a relatively fast response time, and relatively high luminance.

In general, in an Organic Light Emitting Diode (OLED), holes injected from an anode electrode and electrons injected from a cathode electrode may be combined in an organic light emitting layer to form excitons, and the excitons may emit light while emitting energy.

An inverted OLED may have an inverted structure, which may have relatively high energy efficiency and a relatively long lifespan.

SUMMARY OF THE INVENTION

An exemplary embodiment of the present invention provides an organic light emitting diode, including a cathode electrode and an anode electrode positioned above the cathode electrode. An emitting layer is positioned between the cathode electrode and the anode electrode. An electron transporting unit is positioned between the cathode electrode and the emitting layer. The electron transporting unit is configured to inject and transport electrons to the emitting layer. A buffer layer is disposed between the cathode electrode and the electron transporting unit. The buffer layer includes an organic layer and a metallic layer disposed on the organic layer.

The electron transporting unit may include an electron transporting layer positioned between the cathode electrode and the emitting layer. An electron injecting layer may be positioned between the cathode electrode and the electron transporting layer.

The organic layer may include a same material as a material included in any one of the hole injecting layer or the electron transporting layer.

The organic layer may include a first base layer including a same material as a material included in the electron injecting layer, and a second base layer including a same material as a material included in the electron transporting layer.

The metallic layer may include any one of silver (Ag), aluminum (Al), magnesium (Mg), ytterbium (Yb), samarium (Sm), or an alloy thereof.

The buffer layer may have a thickness of from about 0.1 nm to about 20 nm.

The organic light emitting diode may include a hole transporting unit positioned between the emitting layer and the anode electrode.

The hole transporting unit may include a hole transporting layer positioned between the emitting layer and the anode electrode. A hole injecting layer may be positioned between the hole transporting layer and the anode electrode.

The hole injecting layer may include a p-type dopant.

In the hole injecting layer, a doping range of the p-type dopant may be from about 0.5% to about 10%.

The hole injecting layer may have a thickness of about 15 nm or more.

An exemplary embodiment of the present invention includes a display device including a substrate and at least one thin film transistors positioned above the substrate. An organic light emitting diode is connected to the thin film transistor. The organic light emitting diode includes a cathode electrode connected to the thin film transistor. An anode electrode is positioned above the cathode electrode. An emitting layer is positioned between the cathode electrode and the anode electrode. An electron transporting unit is positioned between the cathode electrode and the emitting layer. The electron transporting layer is configured to inject and transport electrons to the emitting layer. A buffer layer is disposed between the cathode electrode and the electron transporting unit. The buffer layer includes an organic layer and a metallic layer disposed on the organic layer.

An exemplary embodiment of the present invention provides an organic light emitting diode with relatively high efficiency and a relatively long lifespan.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE INVENTION

Figure 1:
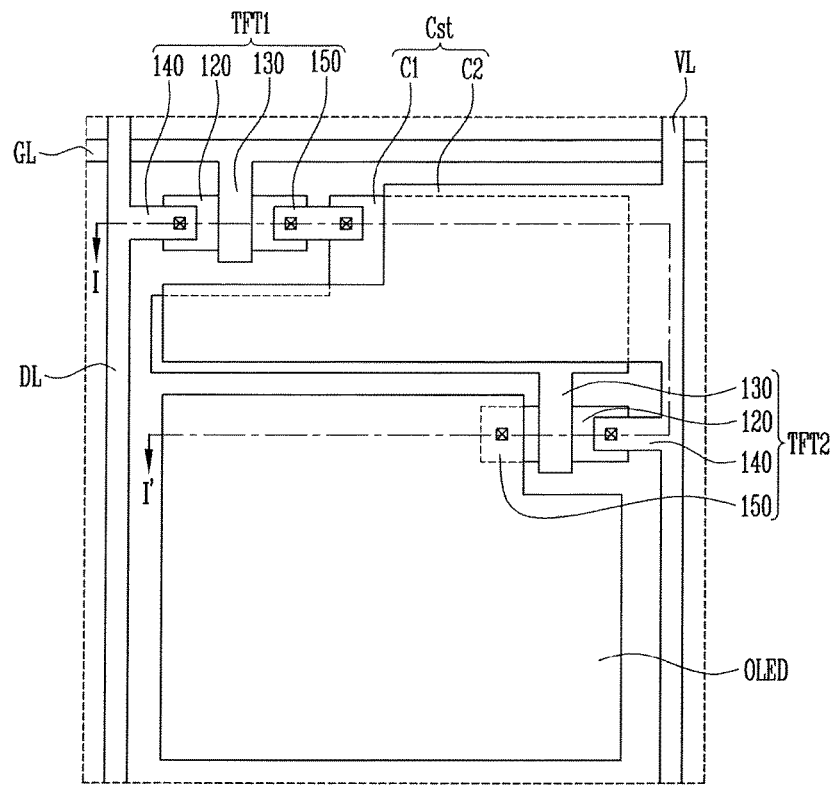
FIG. 1 is a top plan view illustrating a display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings. Sizes of elements in the drawings may be exaggerated for clarity of description.

It will be understood that although the terms "first" and "second" may be used herein to describe various components, these components should not be limited by these terms.

It will be understood that when a component, such as a layer, a film, a region, or a plate, is referred to as being "on" another component, the component may be directly on the other component or intervening components may be present.

Figure 2:
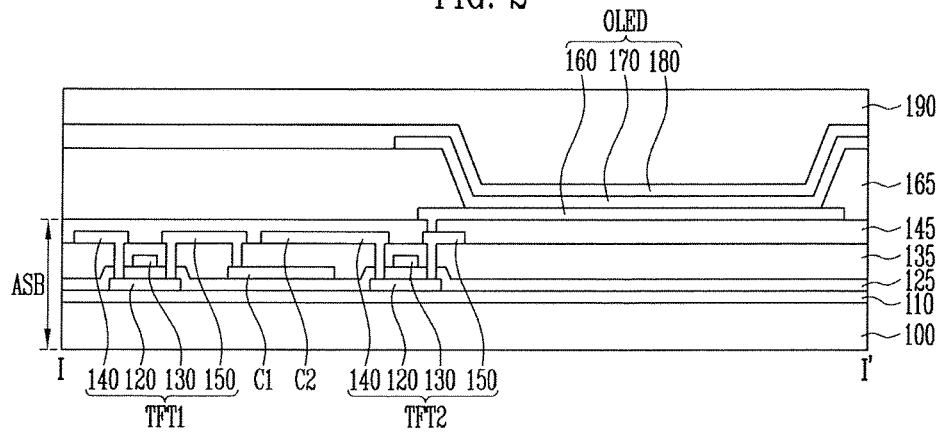
FIG. 2 is a cross-sectional view taken along line I-I' of FIG. 1.

FIG. 1 is a top plan view illustrating a display device according to an exemplary embodiment of the present invention. FIG. 2 is a cross-sectional view taken along line I-I' of FIG. 1.

Referring to FIGS. 1 and 2, a display device may include an array substrate, an organic light emitting diode OLED disposed on the array substrate, and an encapsulating layer 190 substantially covering the organic light emitting diode OLED.

The array substrate may include a base substrate 100, and a first thin film transistor TFT1, a second thin film transistor TFT2, and a capacitor Cst which are positioned above the base substrate 100.

The base substrate 100 may include a transparent insulating film, which may allow light to pass through. The base substrate 100 may be a relatively rigid substrate. For example, the base substrate 100 may be one of a glass base substrate, a quartz base substrate, a glass ceramic base substrate, and a crystalline glass base substrate.

The base substrate 100 may be a relatively flexible substrate. Here, the base substrate 100 may be one of a film base substrate and a plastic base substrate including a polymer organic material. For example, the base substrate 100 may include one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, or cellulose acetate propionate. The base substrate 100 may additionally include Fiber glass Reinforced Plastic (FRP).

A material included in the base substrate 100 may have resistance (e.g., a heat resistance) up to a relatively high processing temperature during a manufacturing process of the display device.

As an example, the first thin film transistor TFT1 and the second thin film transistor TFT2 may each be a switching device. Thus, the first thin film transistor TFT1 may be connected to a gate line GL and a data line DL.

As an example, the first thin film transistor TFT1 and the second thin film transistor TFT2 may each be a driving device. Thus, the second thin film transistor TFT2 may be connected to the capacitor Cst and a power supply line VL. The first thin film transistor TFT1 may supply a data signal applied to the data line DL to the capacitor Cst according to a gate signal applied to the gate GL. Thus, the capacitor Cst may store a voltage corresponding to the data signal.

Each of the first and second thin film transistors TFT1 and TFT2 may include an active pattern 120, a gate electrode 130, a first electrode unit 140, and a second electrode unit 150.

The active pattern 120 may be positioned above the base substrate 100. The active pattern 120 may include any one of amorphous silicon (a-Si), polycrystalline silicon (p-Si), an oxide semiconductor, or an organic semiconductor. The oxide semiconductor may include at least one of zinc (Zn), indium (In), gallium (Ga), tin (Sn), or a mixture thereof. For example, the oxide semiconductor may include an indium-gallium-zinc oxide (IGZO).

The active pattern 120 may include a source region connected to the first electrode unit 140, a drain region connected to the second electrode unit 150, and a channel region positioned between the source region and the drain region.

The source region and the drain region may be regions, in which impurities are doped or injected.

When the active pattern 120 includes an oxide semiconductor, a light blocking layer may be positioned at an upper portion and a lower portion of each active pattern 120. The light blocking layer may substantially block light incident to the active pattern 120.

An insulating layer 110 may be disposed between the base substrate 100 and the active pattern 120. The insulating layer 110 may include at least one of a silicon oxide (SiOx) or a silicon nitride (SiNx). For example, the insulating layer 110 may include a first layer including a silicon oxide, and a second layer, which is disposed on the first layer and includes a silicon nitride. The insulating layer 110 may also include a silicon oxynitride (SiON). The insulating layer 110 may be an organic insulating layer including an organic material.

The insulating layer 110 may reduce or prevent a diffusion of impurities into the first and second thin film transistors TFT1 and TFT2 from the base substrate 100, thus reducing or preventing a degradation of electric characteristics of the first and second thin film transistors TFT1 and TFT2. The insulating layer 110 may reduce or prevent a permeation of moisture and/or oxygen to the organic light emitting diode OLED from the outside. The insulating layer may planarize a surface of the base substrate 100.

A gate insulating layer 125 may be disposed on the active pattern 120. The gate insulating layer 125 may insulate the active pattern 120 and the gate electrode 130. The gate insulating layer 125 may include at least one of a silicon oxide (SiOx) or a silicon nitride (SiNx).

The gate line GL extended in a predetermined direction (e.g., a row direction), the gate electrode 130, and a first capacitor electrode C1 of the capacitor Cst may be positioned above the gate insulating layer 125. The gate electrode 130 may substantially cover a region in a position corresponding to the channel region of the active pattern 120.

The gate line GL, the gate electrode 130, and the first capacitor electrode C1 may each include at least one of a metal, such as gold (Au), silver (Ag), aluminum (Al), molybdenum (Mo), chrome (Cr), titanium (Ti), nickel (Ni), neodymium (Nd), and copper (Cu), or an alloy of the metals. The gate line GL, the gate electrode 130, and the first capacitor electrode C1 may have a single layer structure; however, exemplary embodiments of the present invention are not limited thereto, and the gate line GL, the gate electrode 130, and the first capacitor electrode C1 may have a multiple layer structure, in which two or more materials among the metals and the alloys are laminated.

As an example, each layer of the multiple layers may include a different material (e.g., one of the metals described above).

An interlayer insulating layer 135 substantially covering the gate line GL, the gate electrode 130, and the first capacitor electrode C1 may be disposed on the gate line GL, the gate electrode 130, and the first capacitor electrode C1. The interlayer insulating layer 135 may be an inorganic insulating layer including an inorganic material. The inorganic material may include a silicon nitride, a silicon oxide, or a silicon oxynitride.

The data line DL, which may be insulated from and may cross the gate line GL, the power supply line VL spaced apart from the data line DL, a second capacitor electrode C2 of the capacitor Cst, and the first and second electrode units 140 and 150 may be disposed on the interlayer insulating layer 135.

The first electrode unit 140 and the second electrode unit 150 may be insulated from the gate electrode 130 by the interlayer insulating layer 135. The first electrode unit 140 and the second electrode unit 150 may be electrically connected to the source region and the drain region, respectively, by an opening formed in the gate insulating layer 125 and the interlayer insulating layer 135. As an example, the first electrode unit 140 may be one of a source electrode and a drain electrode, and the second electrode unit 150 may be the other of the source electrode and the drain electrode.

The data line DL, the power supply line VL, the second capacitor electrode C2, and the first and second electrode units 140 and 150 may each include a metal. For example, the data line DL, the power supply line VL, the second capacitor electrode C2, and the first and second electrode units 140 and 150 may each include at least one metal, such as gold (Au), silver (Ag), aluminum (Al), molybdenum (Mo), chrome (Cr), nickel (Ni), neodymium (Nd), and copper (Cu), or an alloy of the metals. The data line DL, the power supply line VL, the second capacitor electrode C2, and the first and second electrode units 140 and 150 may each have a single layer structure; however, exemplary embodiments of the present invention are not limited thereto. The gate line GL, the gate electrode 130, and the first capacitor electrode C1 may each have a multiple layer structure, in which two or more materials among the metals and the alloys are laminated to form multiple layers. As an example, each layer of the multiple layers may include a different material (e.g., one of the metals described above).

In an exemplary embodiment of the present invention, both the first and second thin film transistors TFT1 and TFT2 may have a top gate structure; however, exemplary embodiments of the present invention are not limited thereto. For example, at least one of the first and second thin film transistors TFT1 and TFT2 may be a thin film transistor having a bottom gate structure.

The capacitor Cst may include the first capacitor electrode C1 and the second capacitor electrode C2. The first capacitor electrode C1 may include a same material as the gate line GL and the gate electrode 130. The second capacitor electrode C2 may include a same material as the data line DL, the power supply line VL, and the first and second electrode units 140 and 150, and may be in a same layer as the data line DL, the power supply line VL, and the first and second electrode units 140 and 150.

A passivation layer 145 may be positioned above the base substrate 100. The passivation layer 145 may be positioned above the first and second thin film transistors TFT1 and TFT2 and the capacitor Cst. The passivation layer 145 may substantially cover the first and second thin film transistors TFT1 and TFT2 and the capacitor Cst. The passivation layer 145 may include one or more layers. The passivation layer 145 may planarize upper surfaces of the underlying structures by mitigating a curve of the upper surfaces of the underlying structures. The passivation layer 145 may include a contact hole exposing a part of the second source electrode 150. The passivation layer 145 may be an organic insulating layer including an organic material. The organic material may include an organic insulating material, such as a polyacrylic compound, a polyimide compound, a fluorinate carbon compound, such as Teflon, and/or a benzocyclobutene compound.

The organic light emitting diode OLED, which is electrically connected with the second electrode unit 150 of the second thin film transistor TFT2, may be disposed on the passivation layer 145.

The organic light emitting diode OLED may include a cathode electrode 160 connected to the second thin film transistor TFT2, an organic emitting layer 170 disposed on the cathode electrode 160, and an anode electrode 180 disposed on the organic emitting layer 170.

At least one of the cathode electrode 160 and the anode electrode 180 may be a transmissive electrode. For example, when the organic light emitting diode OLED is a dual emission type organic light emitting diode, both the cathode electrode 160 and the anode electrode 180 may be transmissive electrodes. When the organic light emitting diode OLED is a top emission type organic light emitting diode, the cathode electrode 160 may be a reflective electrode, and the anode electrode 180 may be a transmissive electrode. When the organic light emitting diode OLED is a bottom emission type organic light emitting diode, the cathode electrode 160 may be a transmissive electrode, and the anode electrode 180 may be a reflective electrode. An exemplary embodiment of the present invention in which the organic light emitting diode OLED has the top emission type will be described in more detail below; however, exemplary embodiments of the present invention are not limited thereto.

The cathode electrode 160 may be connected to the second thin film transistor TFT2 and may receive a driving current applied from the second thin film transistor TFT2.

The cathode electrode 160 may include one or more metals, such as magnesium (Mg), aluminum (Al), calcium (Ca), vanadium (V), chrome (Cr), copper (Cu), zinc (Zn), or gold (Au), or an alloy thereof; however, exemplary embodiments of the present invention are not limited thereto. As an example, the cathode electrode 160 may be patterned and positioned in each of the plurality of pixel areas of the base substrate 100.

A pixel defining layer 165 may be disposed on the cathode electrode 160 and the passivation layer 145. The pixel defining layer 165 may expose a part of the cathode electrode 160. For example, the pixel defining layer 165 may have a shape substantially covering an edge of the cathode electrode 160 and the passivation layer 145.

The pixel defining layer 165 may be an organic insulating layer including an organic material. The organic material may include an organic insulating material, such as a polyacrylic compound, a polyimide compound, a fluorinate carbon compound, such as Teflon, and a benzocyclobutene compound.

The organic emitting layer 170 may have a multi-layer thin film structure including at least an Emitting Layer (EML). For example, the organic emitting layer 170 may include an Electron Injection Layer (EIL) injecting electrons. The organic emitting layer 170 may include an Electron Transport Layer (ETL) for smoothly transporting electrons to the emitting layer, the emitting layer generating light by a recombination of the injected electrons and holes. The organic emitting layer 170 may include a Hole Injection Layer (HIL) injecting holes. The organic emitting layer 170 may include a Hole Transport Layer (HTL), which has a relatively high hole transporting rate, suppresses the electrons, which fail to be combined in the emitting layer, from moving, and increases an opportunity of a recombination of the holes and the electrons. A color of light generated in the emitting layer may be any one of red, green, blue, or white; however, exemplary embodiments of the present invention are not limited thereto. For example, a color of light generated in the emitting layer of the organic layer OL may any one of magenta, cyan, or yellow.

The anode electrode 180 may be disposed on the organic emitting layer 170. The anode electrode 180 may include a material having a relatively larger work function than that of the cathode electrode 160. As an example, the anode electrode 180 may include a transparent conductive oxide material. For example, the transparent conductive oxide may include at least one of an indium tin oxide (ITO), an indium zinc oxide (IZO), an aluminum zinc oxide (AZO), a gallium doped zinc oxide (GZO), a zinc tin oxide (ZTO), a Gallium tin oxide (GTO), or fluorine doped tin oxide (FTO).

The encapsulating layer 190 may isolate the organic light emitting diode OLED from an outside environment. Thus, the encapsulating layer 190 may be disposed on the anode electrode 180, which may reduce or prevent permeation of moisture and oxygen into the organic light emitting diode OLED.

Figure 3:
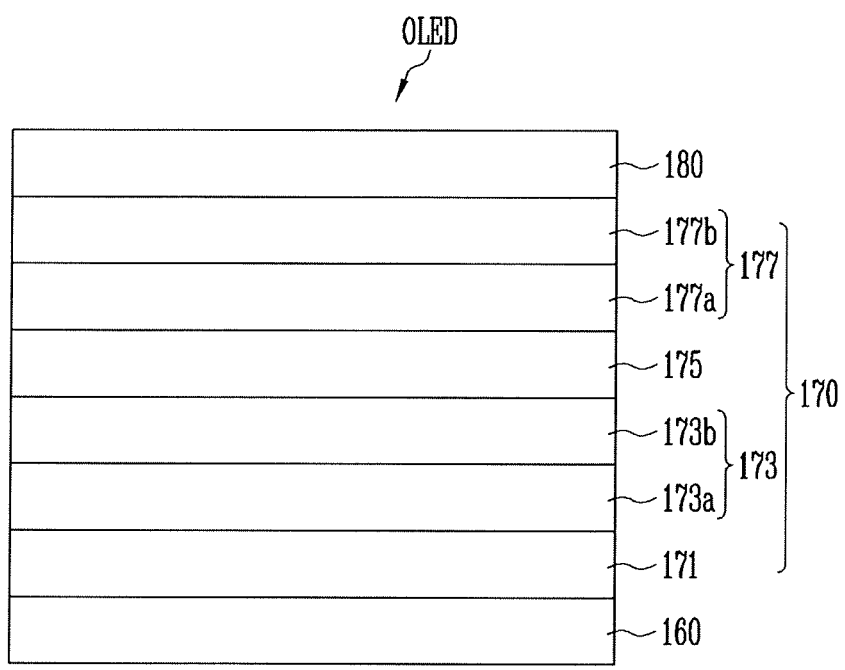
FIG. 3 is a cross-sectional view illustrating an organic light emitting diode of FIG. 2.
Figure 4:
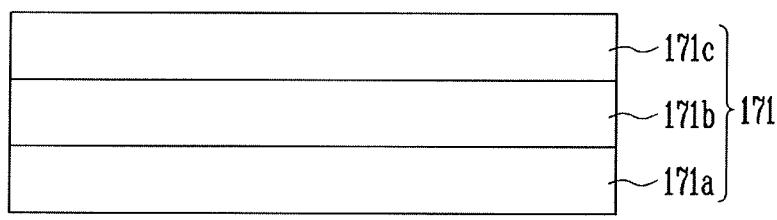
FIG. 4 is a cross-sectional view illustrating a first buffer layer which may be included in the organic light emitting diode described with reference to FIG. 3.

FIG. 3 is a cross-sectional view illustrating an organic light emitting diode of FIG. 2. FIG. 4 is a cross-sectional view illustrating a first buffer layer which may be included in the organic light emitting diode described with reference to FIG. 3.

Referring to FIGS. 2 to 4, the organic light emitting diode OLED may include the cathode electrode 160, the organic emitting layer 170 disposed on the cathode electrode 160, and the anode electrode 180 disposed on the organic emitting layer 170.

The cathode electrode 160 may be a reflective electrode. The reflective electrode may include at least one of magnesium (Mg), aluminum (Al), aluminum-lithium (Al—Li), calcium (Ca), magnesium-indium (Mg—In), or magnesium-silver (Mg—Ag). The cathode electrode 160 may include two different types of materials. The cathode electrode 160 may have a structure of dual layers including two different types of materials, respectively; however, exemplary embodiments of the present invention are not limited thereto.

The organic emitting layer 170 may be disposed on the cathode electrode 160. The organic emitting layer 170 may include an electron transporting unit 173 positioned above the cathode electrode 160, an emitting layer 175 disposed on the electron transporting unit 173, and a second hole transporting unit 177 disposed on the emitting layer 175. The electron transporting unit 173 and the hole transporting unit 177 may be integrally formed throughout the plurality of pixels.

The electron transporting unit 173 may include an electron injecting layer 173a and an electron transporting layer 173b.

The electron injecting layer 173a may move the electrons injected from the cathode electrode 160 to the emitting layer 175. The electron injecting layer 173a may include an electron injecting material. For example, the electron injecting layer 173a may include a material selected from fullerene, methanofullerene, doped fullerene, fullerene methanofullerene, derivatives thereof, or a mixture thereof.

Alternatively, the electron injecting layer 173a may include at least one of LiF, CsF, $Li_2O$, or BaO, or may include at least one of an iodine-based compound, Yb, or $YbF_3$. The iodine-based compound may be at least one of LiI, NaI, CsI, KI, or RbI. The electron injecting layer 173a may additionally include a material having an n-type semiconductor characteristic.

The electron transporting layer 173b may include an electron transporting material. The electron transporting material may include at least one of Bphen(4,7-diphenyl-1, 10-phenanthroline), TPQ1(tris-phenylquinoxalines 1,3,5-tris[(3-phenyl-6-trifluoromethyl)quinoxaline-2-yl]benzene), TPQ2(tris-phenylquinoxalines 1,3,5-tris[{3-(4-tert-butyl-phenyl)-6-trifluoromethyl}quinoxaline-2-yl]benzene), BeBq2(10-benzo[h]quinolinol-beryllium), E3(terfluorene), or derivatives thereof; however, exemplary embodiments of the present invention are not limited thereto. The electron transporting layer 173b may include a same material as that of the electron injecting layer 173a. The electron transporting layer 173b may include n-type dopant. The n-type dopant may include at least one of metallic salt, a metal oxide, or organic metallic salt. The metallic salt may include one of an alkali metal or a halide of an alkali earth metal. The halide of the alkali earth metal may be at least one of LiF, NaF, KF, RbF, CsF, $MgF_2$, $CaF_2$, $SrF_2$, $BaF_2$, LiCl, NaCl, KCl, RbCl, CsCl, $MgCl_2$, $CaCl_2$, $SrCl_2$, or $BaCl_2$. The metallic oxide may be one of an alkali metal or an oxide of an alkali metal. The oxide of the alkali metal may include at least one of LiQ, $LiO_2$, $NaO_2$, $BrO_2$, $Cs_2O$, MgO, or CaO.

The emitting layer 175 may be disposed on the electron transporting layer 173b. The emitting layer 175 may include a low-molecular emitting material and/or a polymer emitting material. The emitting layer 175 may be formed by a predetermined selected method such as a vacuum depositing method, a spin coating method, a cast method, a Langmuir-Blodgett (LB) method, a spray coating method, a dip coating method, a gravure coating method, a reverse offset coating method, a screen printing method, a slot-die coating method, or a nozzle printing method.

The emitting layer 175 may include a single emitting material, or may include a host and dopant. The emitting layer 175 may include a mixture or a blend of various polymer and low-molecular materials. Thus, the emitting layer 175 may emit light of various colors including blue, green, red, or white.

The hole transporting unit 177 may be disposed on the emitting layer 175. The hole transporting unit 177 may include a hole transporting layer 177a and a hole injecting layer 177b sequentially laminated on the emitting layer 175.

The hole transporting layer 177a may move the holes, which are injected from the anode electrode 180 and pass through the hole injecting layer 177b, to the emitting layer 175.

The hole transporting layer 177a may include a hole transporting material. For example, the hole transporting material may include at least one of NPB(4,4'-bis[N-(1-naphthyl)-N-phynylamino]biphenyl); TPD(4,4'-bis[N-(3-methylphenyl)-N-phynylamino]biphenyl); MTDATA(4,4', 4"-tris[(3-methylphenyl)phynylamino]triphenylamine); TAPC(1,1-bis(4-(N,N-di-p-tolyamino)penyl)cyclohexane); TCTA(4-(9H-cabazole-9-yl)-N,N-bis[4-(9H-cabazole-9-yl) penyl]-benzeneamine); CBP(9,9'-[1,1'-biphenyl]-4,4'-diyl-bis-9H-cabazole); Alq3; mCP(9,9'-(1,3-phenylene)bis-9H-cabazole), or 2-TNATA(4,4',4"-tris(N-(2-naphthyl)-N-phynylamino) triphenylamine); however, exemplary embodiments of the present invention are not limited thereto.

The hole injecting layer 177b may be disposed on the hole transporting layer 177a. The hole injecting layer 177b may move the holes injected from the anode electrode 180 in a direction, in which the emitting layer 175 is positioned, and may assist the injection of the holes.

The hole injecting layer 177b may include a hole injecting material, a metal oxide, or organic p-type dopant. The metal oxide may be an oxide including a transition metal. Examples of the transition metal may include molybdenum (Mo), tungsten (W), vanadium (V), rhenium (Re), ruthenium (Ru), chrome (Cr), manganese (Mn), nickel (Ni), iridium (Ir), APC (silver-palladium-copper alloy), or a combination thereof. Examples of the metal oxide may include $MoO_3$, $MoO_2$, $WO_3$, $V_2O_6$, $ReO_3$, or NiO. Examples of the organic p-type dopant may include tetrafluoro-tetracyano-quinodi-methane(F4-TCNQ) or tris[1,2-bis(trifluoromethyl)ethane-1,2-dithiolene[Mo(tfd)$_3$].

The hole injecting layer 177b may include the metal oxide or the organic p-type dopant in an amount of from about 0.1% to about 25% based on a total weight of a hole injecting material included in the hole injecting layer 177b. In an exemplary embodiment of the present invention, the hole injecting layer 177b may include the organic p-type dopant as the hole injecting material. The organic p-type dopant may be included within the hole injecting material of the hole injecting layer 177b within a doping range of from about 0.5% to about 10% based on the total weight of the hole injecting material.

The anode electrode 180 may be disposed on the hole injecting layer 177b. The anode electrode 180 may include a material having a relatively larger work function.

The organic light emitting diode OLED may include a buffer layer 171 positioned between the cathode electrode 160 and the electron transporting unit 173.

The buffer layer 171 may increase the injection of the electrons of the organic light emitting diode OLED. The buffer layer 171 may include an organic layer disposed on the cathode electrode 160 and a metallic layer 171c disposed on the organic layer. The organic layer may include a first base layer 171a and a second base layer 171b sequentially laminated on the cathode electrode 160.

The first base layer 171a may include a same material as that of the electron injecting layer 173a. The second based layer 171b may be disposed on the first base layer 171a and may include a same material as that of the electron transporting layer 173b.

The first base layer 171a may be positioned under the second base layer 171b within the buffer layer 171; however, exemplary embodiments of the present invention are not limited thereto, and the first base layer 171a may be positioned above the second base layer 171b within the buffer layer 171. For example, the first base layer 171a may be disposed on the second base layer 171b within the buffer layer 171.

The metallic layer 171c may be disposed on the second base layer 171b, and may include a conductive material. The conductive material may include a metal. For example, the metal may be any one selected from silver (Ag), aluminum (Al), magnesium (Mg), ytterbium (Yb), samarium (Sm), or mixed metals thereof. The metallic layer 171c may include a same material as that of the cathode electrode 160 first base layer 171a may be positioned under the second base layer 171b within the buffer layer 171, and the metallic layer 171c may include a metal for injecting electrons.

The buffer layer 171 including the first base layer 171a, the second base layer 171b, and the metallic layer 171c may have a thickness of from about 0.1 nm to about 20 nm. When the thickness of the buffer layer 171 is within this range, light efficiency of the organic light emitting diode OLED may be increased and brightness of the organic light emitting diode OLED may be increased.

Some of the metal particles of the metallic layer 171c may be diffused to the second base layer 171b in an interface between the second base layer 171b and the metallic layer 171c by a material characteristic of each of the second base layer 171b and the metallic layer 171c.

When the metallic layer 171c is disposed on the second base layer 171b including an organic material having lower energy than that of the metal, some of the metal particles of the metallic layer 171c may be diffused to the second base layer 171b. Thus, the organic material and the metal particles may be mixed within the second base layer 171b. As an example, the second base layer 171b may be a mixed layer, in which the organic material and the metal particles are mixed, and may also be a diffusion layer, in which some of the metal particles of the metallic layer 171c are diffused.

When the buffer layer 171 including the second base layer 171b is disposed between the cathode electrode 160 and the electron transporting unit 173, an electron injection characteristic between the cathode electrode 160 and the electron transporting unit 173 may be changed. For example, the metal particles diffused to the second base layer 171b of the buffer layer 171 may increase the electron injection from the cathode electrode 160 to the emitting layer 175.

In general, a non-inverted OLED may have a structure, in which an anode electrode, a hole injecting layer, a hole transporting layer, an emitting layer, an electron transporting/injecting layer, and a cathode electrode are sequentially laminated. In such a non-inverted OLED, a diffusion layer, which is formed by the diffusion of some of the metal particles of the cathode electrode to the electron transporting/injecting layer, may be formed in an interface between the electron transporting/injecting layer and the cathode electrode by a material characteristic. The metal particles within the diffusion layer may increase the electron injection to the emitting layer from the cathode electrode, thus increasing an electron injection characteristic of the normal organic light emitting diode.

An inverted OLED, which may have higher efficiency than that of the non-inverted OLED, may have a structure, in which a cathode electrode, an electron injecting/transporting layer, an emitting layer, a hole transporting layer, a hole injecting layer, and an anode electrode are sequentially laminated. In the inverted OLED, the electron injecting/transporting layer including an organic material having lower energy may be disposed on the cathode electrode, so that the diffusion is not formed in an interface between the cathode electrode and the electron injecting/transporting layer. Thus, the inverted OLED might not have the same characteristics as that of the non-inverted OLED.

Thus, the organic light emitting diode OLED according to an exemplary embodiment of the present invention, which may be an inverted OLED, may include the buffer layer 171 between the cathode electrode 160 and the electron transporting unit 173.

Figure 5:
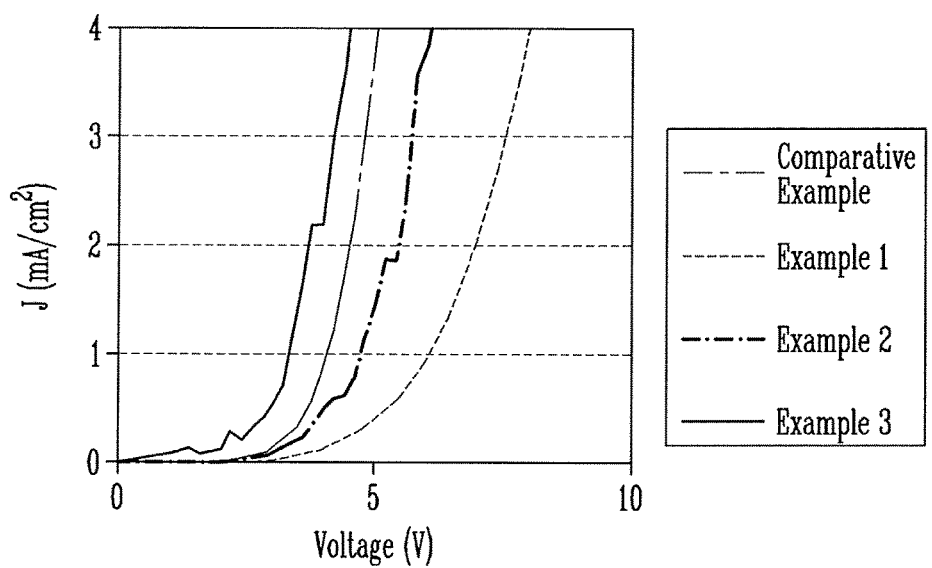
FIG. 5 is a graph illustrating exemplary performance of the organic light emitting diode of FIG. 3 and exemplary performance of an organic light emitting diode of a Comparative Example.

FIG. 5 is a graph illustrating exemplary performance of the organic light emitting diode of FIG. 3 and exemplary performance of an organic light emitting diode of a Comparative Example. The graph of FIG. 5 represents exemplary measurements of a relation between a current density J and a voltage V for the organic light emitting diode of the Examples and an organic light emitting diode of the Comparative Examples.

In the graph of FIG. 5, the Comparative Example includes some elements of a non-inverted organic light emitting diode, in which an anode electrode, an electron transporting layer, an electron injecting layer, and a cathode electrode are sequentially laminated. The electron transporting layer of the Comparative Example may have a thickness of about 1,000 Å and the electron injecting layer of the Comparative Example may have a thickness of about 15 Å.

In the graph of FIG. 5, Example 1 includes some elements of an inverted organic light emitting diode, in which a cathode electrode, a buffer layer, an electron transporting layer, and an anode electrode are sequentially laminated. Here, the buffer layer of Example 1 may include a first base layer (e.g., including a same material as that of the electron injecting layer of the Comparative Example) having a thickness of about 5 Å, a second base layer (e.g., including a same material as that of the electron transporting layer of the Comparative Example) having a thickness of about 5 Å, and a metallic layer having a thickness of about 5 Å. The electron transporting layer of Example 1 may have substantially a same thickness as that of the electron transporting layer of the Comparative Example.

In the graph of FIG. 5, Example 2 may include some elements of the inverted organic light emitting diode which are substantially the same as that of Example 1. The buffer layer of Example 2 may include a first base layer (e.g., including a same material as that of the electron injecting layer of the Comparative Example) having a thickness of about 10 Å, a second base layer (e.g., including a same material as that of the electron transporting layer of the Comparative Example) having a thickness of about 10 Å, and a metallic layer having a thickness of about 10 Å. The electron transporting layer of Example 2 may have a same thickness as that of the electron transporting layer of the Comparative Example.

In the graph of FIG. 5, Example 3 may include some elements of the inverted organic light emitting diode which are substantially the same as those of Examples 1 and 2. The buffer layer of Example 3 may include a second base layer (e.g., including a same material as that of the electron transporting layer of the Comparative Example) having a thickness of about 10 Å, a first base layer (e.g., including a same material as that of the electron injecting layer of the Comparative Example) having a thickness of about 10 Å, and a metallic layer having a thickness of about 10 Å. The electron transporting layer of Example 3 may have substantially a same thickness as that of the electron transporting layer of the Comparative Example.

Referring to FIGS. 3 and 5, the Comparative Example and the Examples may have substantially equivalent electron injecting characteristics. For example, Examples 2 and 3 including the thicker buffer layers than the buffer layer of Example 1 may exhibit an electron injecting characteristic at substantially the same level as that of the Comparative Example. It may be considered that this means that the buffer layers included in Examples 2 and 3 increases the electron injecting characteristic.

Figure 6:
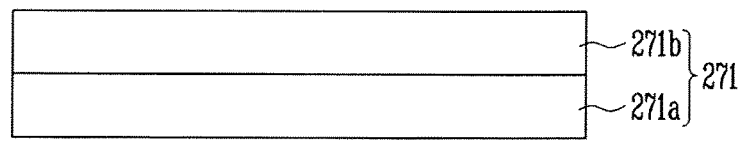
FIG. 6 is a cross-sectional view illustrating a first buffer layer which may be included in the organic light emitting diode described with reference to FIG. 3.

FIG. 6 is a cross-sectional view illustrating a first buffer layer which may be included in the organic light emitting diode described with reference to FIG. 3.

Referring to FIGS. 3 and 6, a buffer layer 271 may include an organic layer 271a disposed on a cathode electrode 160 and a metallic layer 271b disposed on the organic layer 271a.

The organic layer 271a may include a same material as that of any one of the electron injecting layer 173a and the electron transporting layer 173b. For example, the organic layer 271a may include a same material as that of the electron injecting layer 173a. The organic layer 271a may include a same material as that of the electron transporting layer 173b.

The metallic layer 271b may be disposed on the organic layer 271a, and may include a conductive material. The conductive material may include a metal. For example, the metal may be any one selected from silver (Ag), aluminum (Al), magnesium (Mg), ytterbium (Yb), samarium (Sm), or an alloy thereof.

The buffer layer 271 including the organic layer 271a and the metallic layer 271b may have a thickness of from about 0.1 nm to about 20 nm.

Some of the metal particles of the metallic layer 271b may be diffused to the organic layer 271a by a material characteristic of each of the organic layer 271a and the metallic layer 271b in an interface between the organic layer 271a and the metallic layer 271b. Thus, the organic layer 271a may be a mixed layer, in which an organic material and the metal particles are mixed, and may also be a diffusion layer formed by the diffusion of some of the metal particles of the metallic layer 271b.

Figure 7:
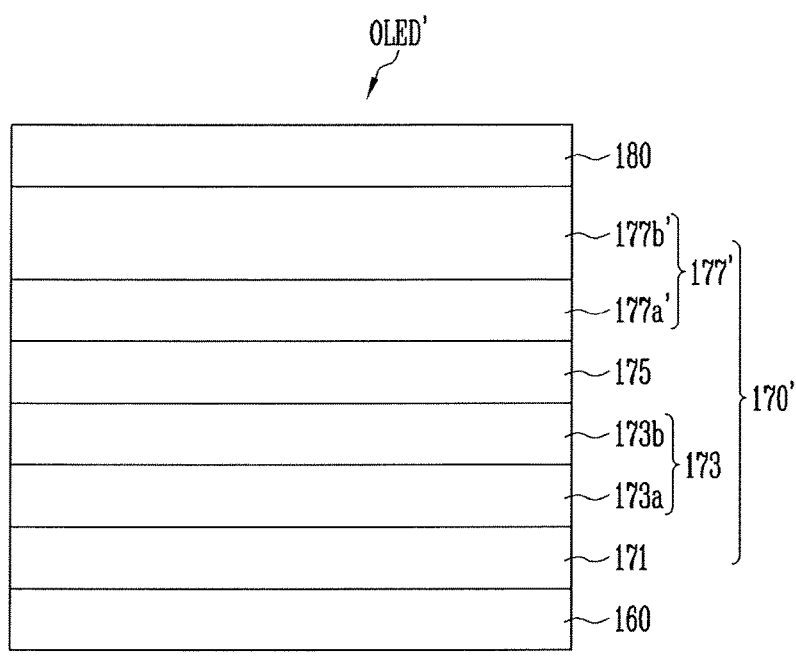
FIG. 7 is a cross-sectional view illustrating an organic light emitting diode according to an exemplary embodiment of the present invention.

FIG. 7 is a cross-sectional view illustrating an organic light emitting diode according to an exemplary embodiment of the present invention. The organic light emitting diode according to an exemplary embodiment of the present invention described with reference to FIG. 7 may be substantially the same as the organic light emitting diode described above, and thus duplicative descriptions may be omitted and differences from the organic light emitting diode described above may be focused on below with reference to FIG. 7.

Referring to FIG. 7, an organic light emitting diode OLED' may include the cathode electrode 160, an organic emitting layer 170' disposed on the cathode electrode 160, and an anode electrode 180 disposed on the organic emitting layer 170'.

The organic emitting layer 170' may include the buffer layer 171, the electron transporting unit 173, the emitting layer 175, and a hole transporting unit 177'.

The buffer layer 171 may include an organic layer and a metallic layer disposed on the organic layer.

The electron transporting unit 173 may include an electron injecting layer 173a and an electron transporting layer 173b, which are sequentially disposed on the buffer layer 171. The electron injecting layer 173a and the electron transporting layer 173b may move the electrons injected from the cathode electrode 160 to the emitting layer 175.

The emitting layer 175 may be disposed on the electron transporting unit 173. The emitting layer 175 may be a layer in which excitons generated by a combination of electrons passing from the cathode electrode 160 via the electron transporting unit 173 and holes passing from the anode electrode 180 via the hole transporting unit 177' emit light while being changed from an excitation state to a ground state.

The hole transporting unit 177' may be disposed on the emitting layer 175. The hole transporting unit 177' may include a hole transporting layer 177a' and a hole injecting layer 177b'.

The hole transporting layer 177a may move the holes, which are injected from the anode electrode 180 and pass through the hole injecting layer 177b', to the emitting layer 175.

The hole injecting layer 177b' may be disposed on the hole transporting layer 177a. The hole injecting layer 177b' may include a hole injecting material including an organic material, a metal oxide, or organic p-type dopant.

When the hole injecting layer 177b', which includes an organic material having lower energy than that of the anode electrode 180, is positioned under the anode electrode 180, some of the metal particles of the anode electrode 180 may be diffused to the hole injecting layer 177b' by a material characteristic. When some of the metal particles of the anode electrode 180 are diffused to the hole injecting layer 177b', the organic p-type dopant included in the hole injecting layer 177b' may generate a reaction with the metal particles and may be denaturalized. Thus, a hole injection characteristic of the hole injecting layer 177b' may be degraded, and thus a hole injection characteristic of the organic light emitting diode OLED' may be degraded.

The organic light emitting diode OLED' according to an exemplary embodiment of the present invention may include the hole injecting layer 177b' having a thickness of about 15 nm or more, and thus degradation of the hole injection characteristic may be reduced or eliminated. In this case, even though the organic p-type dopant may be denaturalized by the reaction of the metal particles diffused from the anode electrode 180 and the organic p-type dopant of the hole injecting layer 177', the degree of denaturalized organic p-type dopant occupied within the hole injecting layer 177' may be reduced, and thus the degradation of the hole injection characteristic may be reduced or eliminated.

Figure 8:
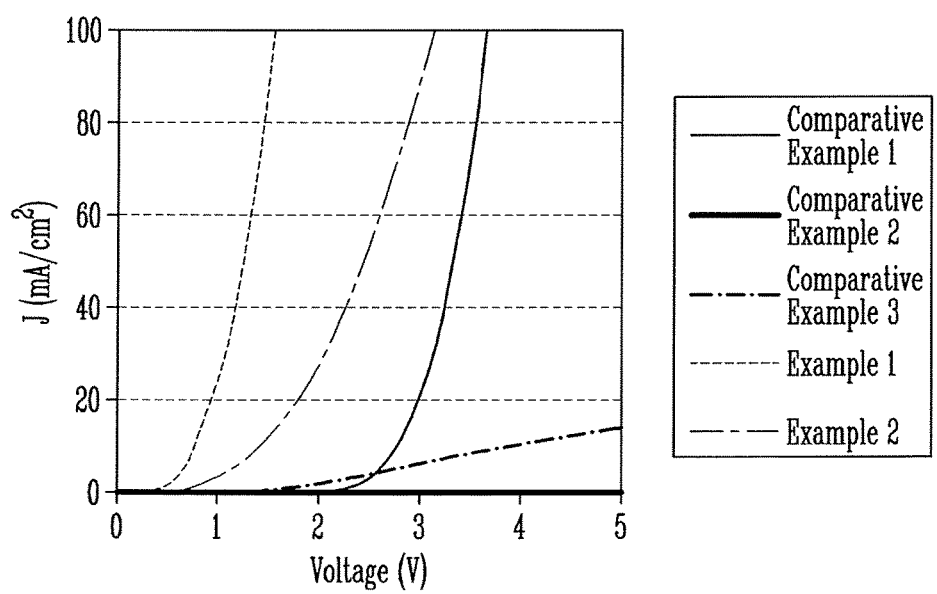
FIG. 8 is a graph illustrating exemplary performance of the organic light emitting diode of FIG. 7 and exemplary performance of an organic light emitting diode of a Comparative Example.

FIG. 8 is a graph illustrating exemplary performance of the organic light emitting diode of FIG. 7 and exemplary performance of an organic light emitting diode of a Comparative Example. The graph of FIG. 8 represents exemplary measurements of a relation between a current density J and a voltage V for the organic light emitting diode of the Examples and an organic light emitting diode of the Comparative Examples.

In the graph of FIG. 8, Comparative Example 1 includes some elements of a non-inverted organic light emitting diode, in which an anode electrode, a hole injecting layer, a hole transporting layer, and a cathode electrode are sequentially laminated. The hole injecting layer of Comparative Example 1 includes organic p-type dopant and has a thickness of about 100 Å, and the hole transporting layer of Comparative Example 1 has a thickness of about 1,000 Å.

In the graph of FIG. 8, Comparative Example 2 includes some elements of an inverted organic light emitting diode, in which a cathode electrode, a hole transporting layer, a hole injecting layer, and an anode electrode are sequentially laminated. The hole transporting layer of Comparative Example 2 has a thickness of about 1,000 Å, and the hole injecting layer of Comparative Example 2 includes organic p-type dopant and has a thickness of about 100 Å.

In the graph of FIG. 8, Comparative Example 3 includes some elements of the inverted organic light emitting diode which are substantially the same as that of Comparative Example 2. The hole transporting layer of Comparative Example 3 may have a same thickness as that of the hole transporting layer of Comparative Example 2. The hole injecting layer of Comparative Example 3 includes organic p-type dopant and has a thickness of about 200 Å.

In the graph of FIG. 8, Example 1 includes some elements of the inverted organic light emitting diode which are substantially the same as that of Comparative Example 2. The hole transporting layer of Example 1 may have a same thickness as that of the hole transporting layer of Comparative Example 2. The hole injecting layer of Example 1 includes organic p-type dopant and has a thickness of about 300 Å.

In the graph of FIG. 8, Example 2 includes some elements of the inverted organic light emitting diode which are substantially the same as that of Comparative Example 2. The hole transporting layer of Example 2 may have a same thickness as that of the hole transporting layer of Comparative Example 2. The hole injecting layer of Example 2 includes organic p-type dopant and has a thickness of about 500 Å.

Referring to FIGS. 7 and 8, Comparative Example 1, Example 1, and Example 2 may have substantially equivalent hole injecting characteristics. For example, Examples 1 and 2 including the thicker hole injecting layers than the hole injecting layer included in Comparative Examples 2 and 3 may exhibit hole injecting characteristic at substantially a same level as that of Comparative Example 1 (e.g., some elements of the normal organic light emitting diode). It may be considered that this means that the degree of damage of the hole injecting layer included in each of Examples 1 and 2 by the reaction with the metal particles diffused from the anode electrode is relatively small.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. An organic light emitting diode, comprising:
   a cathode electrode;
   an anode electrode positioned above the cathode electrode;
   an emitting layer positioned between the cathode electrode and the anode electrode;
   an electron transporting unit positioned between the cathode electrode and the emitting layer, and configured to inject and transport electrons to the emitting layer; and
   a buffer layer disposed between the cathode electrode and the electron transporting unit, and including an organic layer and a metallic layer disposed on the organic layer, wherein the organic layer of the buffer layer is in direct contact with the cathode electrode, and wherein the metallic layer of the buffer layer is spaced apart from the cathode electrode.

2. The organic light emitting diode of claim 1, wherein the electron transporting unit includes:
   an electron transporting layer positioned between the cathode electrode and the emitting layer; and
   an electron injecting layer positioned between the cathode electrode and the electron transporting layer.

3. The organic light emitting diode of claim 2, wherein the organic layer includes a same material as a material included in any one of a hole injecting layer or the electron transporting layer.

4. The organic light emitting diode of claim 2, wherein the organic layer includes a first base layer including a same material as a material included in the electron injecting layer, and a second base layer including a same material as a material included in the electron transporting layer.

5. The organic light emitting diode of claim 1, wherein the metallic layer includes any one of silver (Ag), aluminum (Al), magnesium (Mg), ytterbium (Yb), samarium (Sm), or an alloy thereof.

6. The organic light emitting diode of claim 1, wherein the buffer layer has a thickness of from about 0.1 nm to about 20 nm.

7. The organic light emitting diode of claim 1, further comprising:

a hole transporting unit positioned between the emitting layer and the anode electrode.

8. The organic light emitting diode of claim 7, wherein the hole transporting unit includes:
a hole transporting layer positioned between the emitting layer and the anode electrode; and
a hole injecting layer positioned between the hole transporting layer and the anode electrode.

9. The organic light emitting diode of claim 8, wherein the hole injecting layer includes a p-type dopant.

10. The organic light emitting diode of claim 9, wherein in the hole injecting layer, a doping range of the p-type dopant is from about 0.5% to about 10%.

11. The organic light emitting diode of claim 9, wherein the hole injecting layer has a thickness of about 15 nm or more.

12. A display device, comprising:
a substrate;
at least one thin film transistor positioned above the substrate; and
an organic light emitting diode connected to the thin film transistor,
wherein the organic light emitting diode includes:
a cathode electrode connected to the thin film transistor;
an anode electrode positioned above the cathode electrode;
an emitting layer positioned between the cathode electrode and the anode electrode;
an electron transporting unit positioned between the cathode electrode and the emitting layer, and configured to inject and transport electrons to the emitting layer; and
a buffer layer disposed between the cathode electrode and the electron transporting unit, and including an organic layer and a metallic layer disposed on the organic layer, wherein the organic layer of the buffer layer is in direct contact with the cathode electrode, and wherein the metallic layer of the buffer layer is spaced apart from the cathode electrode.

13. The display device of claim 12, wherein the organic layer includes a same material as a material included in the electron transporting unit.

14. The display device of claim 12, wherein the metallic layer includes any one of silver (Ag), aluminum (Al), magnesium (Mg), ytterbium (Yb), samarium (Sm), or an alloy thereof.

15. An organic light emitting diode, comprising:
a cathode electrode;
a buffer layer disposed on the cathode electrode;
an electron injecting layer disposed on the buffer layer;
an electron transporting layer disposed on the electron injecting layer;
an emitting layer disposed on the electron transporting layer;
a hole transporting layer disposed on the emitting layer;
a hole injecting layer disposed on the hole transporting layer; and
an anode electrode disposed on the hole injecting layer,
wherein the buffer layer includes an organic layer and a metallic layer disposed on the organic layer, wherein the organic layer includes a first base layer including a same material as a material included in the electron injecting layer, and a second base layer including a same material as a material included in the electron transporting layer, and wherein the first base layer is in direct contact with the cathode electrode.

16. The organic light emitting diode of claim 15, wherein the buffer layer has a thickness of from about 0.1 nm to about 20 nm.

17. The organic light emitting diode of claim 15, wherein the hole injecting layer includes p-type dopant.

18. The organic light emitting diode of claim 17, wherein in the hole injecting layer, a doping range of the p-type dopant is from about 0.5% to about 10%.

19. The organic light emitting diode of claim 15, wherein the hole injecting layer has a thickness of about 15 nm or more.

20. The organic light emitting diode of claim 4, wherein the second base layer is in direct contact with the first base layer.

* * * * *